(12) United States Patent
Iizuka

(10) Patent No.: US 7,567,880 B2
(45) Date of Patent: Jul. 28, 2009

(54) INTERFACE CIRCUIT

(75) Inventor: Yoichi Iizuka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/878,045

(22) Filed: Jul. 20, 2007

(65) Prior Publication Data

US 2008/0048747 A1 Feb. 28, 2008

(30) Foreign Application Priority Data

Aug. 22, 2006 (JP) ............................ 2006-225241

(51) Int. Cl.
*H03H 11/26* (2006.01)
(52) U.S. Cl. .................. 702/106; 327/241; 327/273; 327/261
(58) Field of Classification Search ................ 702/106; 327/273, 241, 261, 170, 172–175
See application file for complete search history.

(56) References Cited

U.S. PATENT DOCUMENTS 5,900,762 A * 5/1999 Ramakrishnan ............. 327/277
5,935,257 A 8/1999 Nishimura
6,316,980 B1 * 11/2001 Vogt et al. .................. 327/273
2004/0123207 A1 6/2004 Zumkehr et al.
2004/0143775 A1 7/2004 Li et al.
2006/0052961 A1 3/2006 Best

FOREIGN PATENT DOCUMENTS

| JP | 11-168365 | 6/1999 |
| JP | 2004-185608 | 7/2004 |
| JP | 2006-85650 | 3/2006 |

OTHER PUBLICATIONS

Takeshi Hamamoto et al., 400MHz Random Column Operating SDRAM Techniques with Self-Skew Compensation, IEEE Journal of Solid-State Circuits, vol. 33, No. 5, May 1998.

* cited by examiner

*Primary Examiner*—Drew A Dunn
*Assistant Examiner*—Hien X Vo
(74) *Attorney, Agent, or Firm*—Young & Thompson

(57) ABSTRACT

An interface circuit includes a variable delay circuit and a delay adjustment circuit to automatically detect a data valid window of a DQ signal and adjust an optimum delay amount of a DQS signal, and a fixed delay circuit to delay the DQ signal by a delay amount $t_{FIXDLY}$ satisfying $t_{FIXDLY} > t_{MINDLY} + t_{SKEW} - t_{SETUP}$ where a minimum delay amount in the variable delay circuit is $t_{MINDLY}$, a skew between the DQ signal and the DQS signal is $t_{SKEW}$, and a setup time of the DQ signal is $t_{SETUP}$.

17 Claims, 18 Drawing Sheets

… (US 7,567,880 B2)

INTERFACE CIRCUIT

BACKGROUND OF THE INVENTION

1. Field of the Invention

The present invention relates to an interface circuit that receives a strobe signal output from a semiconductor device such as a memory and LSI and a data signal synchronized with the strobe signal and adjusts the phase shift amount of the strobe signal to latch the data signal.

2. Description of Related Art

FIG. 13 shows a DDR-SDRAM (Double Data Rate Synchronous Dynamic Random-Access Memory) and its interface circuit according to a related art. As shown in FIG. 13, an interface circuit 110 is placed between a DDR-SDRAM 103 and an internal circuit 125 of a semiconductor device 102.

The interface circuit 110 includes a capture circuit 112, a variable delay circuit 113, and a delay adjustment circuit 114. The interface circuit 110 latches a data signal (DQ signal) which is output from the DDR-SDRAM 103 into the capture circuit 112 at the timing of a data strobe signal (DQS signal) which is phase-shifted by the variable delay circuit 113. The DQ signal which is latched into the capture circuit 112 is output to the internal circuit 125.

A DQS signal is phase-shifted so as to latch a DQ signal at the center of a data valid window of the DQ signal. FIG. 14 shows a DQ signal and a phase-shifted DQS signal. A DQ signal and a DQS signal are input to the interface circuit 110 in phase with each other. Thus, the shift amount of a DQS signal is normally 90-deg (shifted DQS) at which a timing margin is maximum (c.f. Japanese Unexamined Patent Application Publication No. 2006-85650, for example). Referring to FIG. 14, the shaded area of the DQ signal contains jitter, setup time, hold time and so on, and the period excluding this area is a data valid window, the midpoint (center) of which is optimum capture timing.

However, because of the phase lag between a DQ signal and a DQS signal which occurs due to a delay difference in DIMM (Dual Inline Memory Module) substrate, a delay time (tPD) difference inside a chip and so on, the 90-deg shift is not a true optimum value in many cases. A timing budget is becoming strict with the recent trend for increasing speed. For this reason, beginning with DDR2, a technique of adjusting a shift amount for optimizing the timing has been employed. A typical example of this technique is to detect a readable range while changing a delay shift amount and set a shift amount to its center (at the position where a timing margin is maximum). As shown in FIG. 15, such a technique generates a plurality of shifted DQS signals (S12 to S16) with various shift amounts of the DQS signal, detects a setup limit (X-deg shift: S12) and a hold limit (Y-deg shift: S16), and determines its middle position ((X+Y)/2 deg shift: S14) as the optimum timing (c.f. Japanese Unexamined Patent Application Publication No. 2004-185608 (Sekiguchi et al.) for example).

Referring back to FIG. 13, the interface circuit 110 includes the variable delay circuit 113 and the delay adjustment circuit 114 in order to perform such delay adjustment. The variable delay circuit 113 generates a DQS signal with a delay value=$t_{MINDLY}+t_{DLYSTEP}*n$ where a minimum delay amount is $t_{MINDLY}$, a step value of a variable delay is $t_{DLYSTEP}$, and n is an integer of 0 or above. The capture circuit 112 captures a DQ signal with a DQS signal having each delay value, and an expectation matching circuit 141 checks whether a value matches with an expected value, thereby determining if the reading is a success or not. The delay adjustment circuit 114 thereby detects a setup limit and a hold limit. A delay amount calculation circuit 142 calculates its middle position as an optimum delay amount, and a delay setting circuit 143 sets the optimum delay amount as a delay value of the variable delay circuit 113.

However, if the speed becomes even higher and the operating frequency (data transfer speed) of DDR2 becomes 800 Mbps (DDR2-800), it is unable to detect a setup limit. It is thus unable to set an optimum value of the timing in such a case. Although slight deviation is allowable if the operating frequency is about 667 Mbps as in DDR2-667, accurate optimization is necessary for the frequency of 800 Mbps or higher, thus requiring the detection of a setup limit.

If an input DQ signal is faster than an input DQS signal due to a delay difference in DIMM substrate or the like or a limit of a minimum delay value of the variable delay circuit 113 is later than a setup time, it is unable to detect a setup limit. Specifically, a limit for advancing the phase of a DQS signal with respect to a DQ signal is generated. In such a case, a DQ signal is latched within a data valid window in spite of a minimum delay, and it is thus unable to detect a setup limit. Specifically, if the position where an input DQS signal is shifted by X-deg is a setup limit, and a minimum delay amount of the variable delay circuit 113 is the position where it is shifted by Z-deg as shown in FIG. 16, a setup limit cannot be detected. Further, even if a minimum delay amount of the variable delay circuit 113 is smaller than X-deg, it is difficult to detect a set up limit when an input DQ signal is faster than an input DQS signal due to line delay or the like.

The above problem is described hereinafter in further detail. In FIG. 13, a DQ signal which is output from a DQ terminal 131 of the DDR-SDRAM 103 is Nd101, and a DQS signal which is output from a DQS terminal 132 of the DDR-SDRAM 103 is Nq101. As shown in FIG. 17, the DQ signal Nd101 and the DQS signal Nq101 are output in phase with each other.

A DQ signal which is input to the interface circuit 110 through a DQ terminal 121 and an input/output buffer 123 of the a semiconductor device 102 is Nd103, and a DQ signal which is output from the capture circuit 112 is Nd104. A DQS signal which is input to the variable delay circuit 113 of the interface circuit 110 through a DQS terminal 122 and an input/output buffer 124 is Nq102, and a DQS signal which is phase-shifted by the variable delay circuit 113 is Nq103. As shown in FIG. 17, the DQ signal Nd103 contains jitter of $t_{JITTER}$. The DQS signal Nq102 is earlier than the DQ signal Nd103 by $t_{SKEW}$ due to line delay or the like.

An optimum delay amount of the DQS signal Nq103 is $t_{BSTDLY}$. Specifically, a rising edge of the DQS signal Nq103 is optimally at the center (t103) of a data valid window excluding a setup time $t_{SETUP}$ and a hold time $t_{HOLD}$ as shown in Nq103 (best).

If a clock cycle is $t_{CYC}$, a jitter of a DQ signal is $t_{JITTER}$, a setup time is $t_{SETUP}$, a hold time is $t_{HOLD}$, a skew between a DQ signal and a DQS signal is $t_{SKEW}$, an optimum shift amount is $t_{BSTDLY}$, an actually required shift amount is $t_{ACTDLY}$, a minimum delay amount of the variable delay circuit 113 is $t_{MINDLY}$, each signal satisfies the following:

Maximum pass delay $t_{PASSMAX} = t_{CYC} - t_{JITTER} - t_{HOLD} - t_{SKEW}$

Calculated delay amount $t_{ACTDLY} = (t_{MINDLY} + t_{PASSMAX})/2$ $$= \left( \begin{array}{c} t_{CYC} + t_{MINDLY} - \\ t_{HOLD} - t_{JITTER} - t_{SKEW} \end{array} \right) / 2$$

-continued

Ideal delay amount $t_{BSTDLY} = (t_{SETUP} - t_{SKEW} + t_{PASSMAX})/2$ $$= \left( \begin{array}{c} t_{CYC} - t_{JITTER} + \\ t_{SETUP} - t_{HOLD} \end{array} \right) \bigg/ 2 t_{SKEW}$$

Error amount $t_{ERROR} = t_{ACTDLY} - t_{BSTDLY}$ $= (t_{MINDLY} - t_{SETUP} + t_{SKEW})/2$ where $t_{BSTMR} = (t_{CYC} - t_{JITTER} - t_{SETUP} - t_{HOLD})/2$ $t_{BSTMR} \gg t_{ERROR}$ when $t_{CYC} \gg t_{MINDLY}, t_{JITTER}, t_{HOLD}, t_{SKEW}$ If the speed becomes higher, the minimum delay amount $t_{MINDLY}$ becomes larger than the setup time $t_{SETUP}$ and its position t102 is later than a setup limit t101, resulting in a failure to detect the setup limit t101. Therefore, an optimum delay amount which can be obtained in the delay adjustment circuit 114 is $t_{ACTDLY}$. Thus, the DQS signal Nq103 is shifted to the center (t104) excluding the minimum delay amount $t_{MINDLY}$ and the holding time $t_{HOLD}$, which is deviated from the original optimum delay position (t103) by $t_{ERROR}$. If the operating frequency is about 667 Mbps, the clock cycle $t_{CYC}$ is sufficiently larger than $t_{MINDLY}, t_{JITTER}, t_{HOLD}, t_{SKEW}, t_{BSTMR}$ and therefore $t_{BSTMR}$ is sufficiently larger than $t_{ERROR}$ as described earlier, so that the lag $t_{ERROR}$ does not cause any significant problem.

However, the operating frequency is 800 Mbps in DDR2-800, and the proportion of $t_{MINDLY}, t_{JITTER}, t_{HOLD}, t_{SKEW}$ and $t_{BSTMR}$ is significantly large with respect to the clock cycle $t_{CYC}$ as shown in FIG. 18. In this case, a data valid window between a setup limit t111 and a hold limit t115 is narrowed and a minimum delay position t112 is significantly later than the setup limit t111, so that the proportion of the lag $t_{ERROR}$ between the original optimum delay position t113 and an actual calculated delay position t114 with respect to $t_{BSTMR}$ is large. An increase in the proportion of $t_{ERROR}$ means an increase in the probability of a failure in reading of a DQ signal. It is therefore necessary to eliminate $t_{ERROR}$ and capture a DQ signal at the center of a data valid window.

SUMMARY

In one embodiment, an interface circuit includes a calibration circuit to automatically detect a data valid window of a data signal and adjust an optimum delay amount of a strobe signal, and a data signal delay circuit to delay the data signal by a delay amount $t_{FIXDLY}$ satisfying $t_{FIXDLY} > t_{MINDLY} + t_{SKEW} - t_{SETUP}$ where a minimum delay amount in the calibration circuit is $t_{MINDLY}$, a skew between the data signal and the strobe signal is $t_{SKEW}$, and a setup time of the data signal is $t_{SETUP}$.

Because the interface circuit of the embodiment of the present invention includes a data signal delay circuit to delay a data signal by a delay amount $t_{FIXDLY}$ satisfying $t_{FIXDLY} > t_{MINDLY} + t_{SKEW} - t_{SETUP}$, it is possible to detect a setup limit and adjust an optimum delay amount of a strobe signal so as to enable capture of a data signal at the center of a data valid window.

The interface circuit according to the present invention can therefore generate a strobe signal which enables latching of a data signal at the center of a data valid window.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
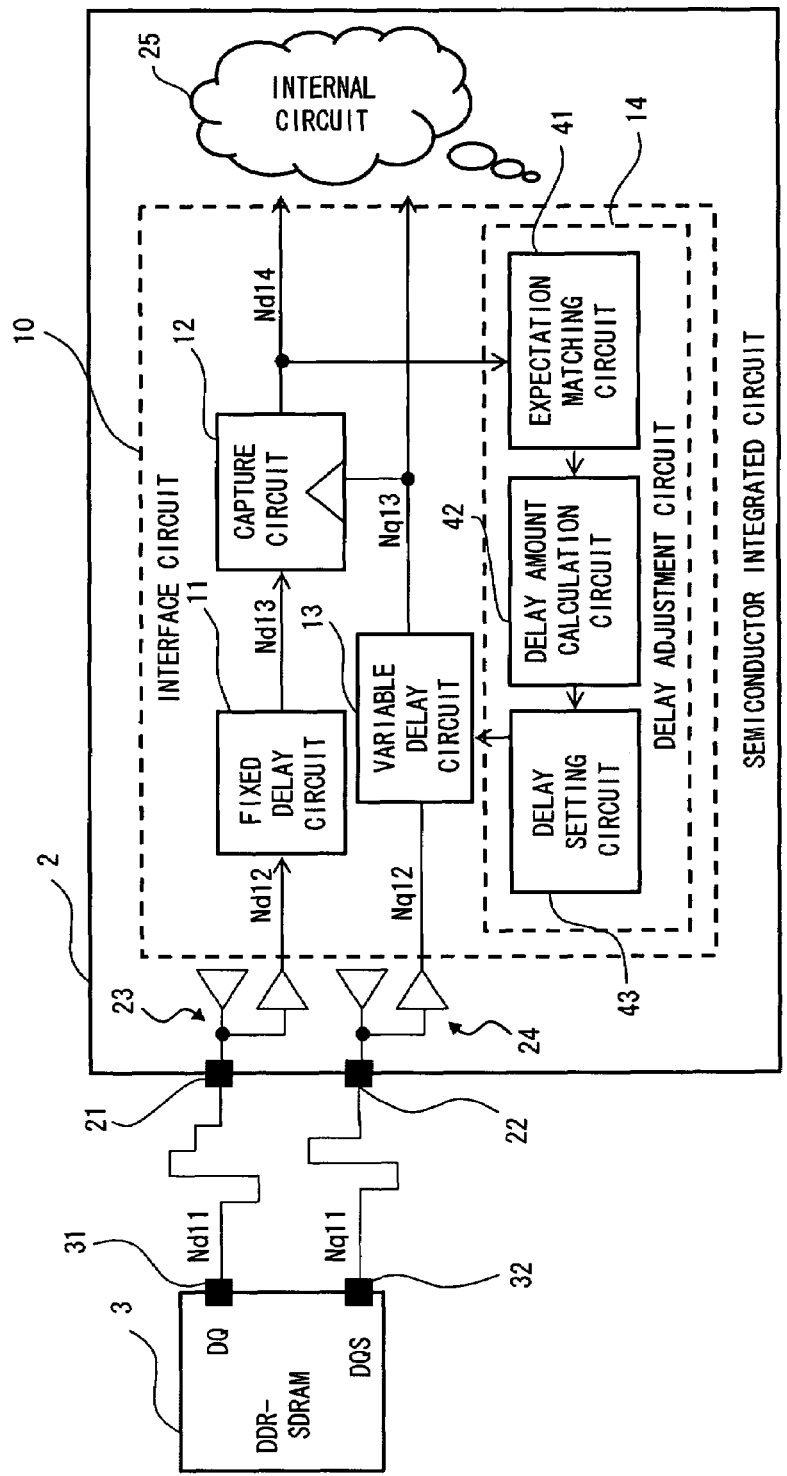
FIG. 1 is a block diagram showing a semiconductor integrated circuit that includes an interface circuit according to a first embodiment of the present invention.

Embodiments of the present invention are described hereinafter in detail with reference to the drawings. FIG. 1 is a block diagram showing a semiconductor integrated circuit that includes an interface circuit according to a first embodiment of the present invention. An interface circuit 10 is such that a fixed delay circuit 11 that delays an input DQ signal by a prescribed delay amount is added to the configuration of the interface circuit according to the related art. As described in detail later, the fixed delay circuit 11 is a data signal delay circuit that delays a DQ signal by a delay amount $t_{FIXDLY}$ which satisfies $t_{FIXDLY} > t_{MINDLY} + t_{SKEW} - t_{SETUP}$ where a minimum delay amount of a delay adjustment circuit is $t_{MINDLY}$, a skew between a DQ signal and a DQS signal is $t_{SKEW}$, and a setup time of a DQ signal is $t_{SETUP}$.

Referring to FIG. 1, the semiconductor integrated circuit 2 includes an internal circuit 25. The semiconductor integrated circuit 2 is connected with a DDR-SDRAM 3 so as to read data from or write data to the DDR-SDRAM 3. To implement such operation, the semiconductor integrated circuit 2 includes the interface circuit 10 which is placed between input/output buffers 23 and 24 that are connected with external terminals 21 and 22, respectively, and the internal circuit 25. The interface circuit 10 includes the fixed delay circuit 11, a capture circuit 12, a variable delay circuit 13, and a delay adjustment circuit 14. The variable delay circuit 13 and the delay adjustment circuit 14 constitute a calibration circuit that automatically detects a data valid window of a DQ signal and automatically adjusts an optimum delay amount of a DQS signal.

A DQ signal Nd11 is output from the DDR-SDRAM 3 through a DQ terminal 31. A DQ signal Nd12, which has passed through the DQ terminal 21 and the input/output buffer 23 of the semiconductor integrated circuit 2, is input to the fixed delay circuit 11. On the other hand, a DQS signal Nq11 is output from the DDR-SDRAM 3 through a DQS terminal 32. A DQS signal Nq12, which has passed through the DQS terminal 22 and the input/output buffer 24 of the semiconductor integrated circuit 2, is input to the variable delay circuit 13. A DQ signal Nd13, which is fixed at a prescribed delay amount in the fixed delay circuit 11, is captured into the capture circuit 12 at a rising edge of a DQS signal Nq13, which is phase-shifted by the variable delay circuit 13. The DQ signal captured into the capture circuit 12 is normally output to the internal circuit 25. Although the capture circuit 12 captures a DQ signal at the timing of a DQS signal, it may output the captured DQ signal in synchronization with a clock of the internal circuit.

On the other hand, during delay adjustment mode where a variable delay amount of the variable delay circuit 13 is determined by the delay adjustment circuit 14, the DQ signal Nd14 which is captured into the capture circuit 12 is input to the delay adjustment circuit 14. The variable delay circuit 13 generates a DQS signal with a variable delay amount=$t_{MINDLY} + t_{DLYSTEP} *n$ where a minimum delay amount is $t_{MINDLY}$, a step value of a variable delay is $t_{DLYSTEP}$, and n is an integer of 0 or above. The capture circuit 12 captures the DQ signal Nd13 at the timing of the DQS signal Nq13 having each delay value.

The delay adjustment circuit 14 includes an expectation matching circuit 41, a delay amount calculation circuit 42, and a delay setting circuit 43. The delay adjustment circuit 14 sets the delay adjustment mode in appropriate timing after product assembly before shipment or the like so as to determine an optimum delay amount to be set to the variable delay circuit 13. In this mode, the delay adjustment circuit 14 first writes the data for expectation matching into the DDR-SDRAM 3 and checks the data against a reading expected value while shifting a delay amount of the variable delay circuit 13, thereby searching for an optimum delay amount. The expectation matching data is held in a holding section (not shown) which is placed in the delay adjustment circuit 14 or the like.

The expectation matching circuit 41 receives the DQ signal Nd14 which is latched into the capture circuit 12 using the DQS signal which is delayed by a variable delay amount. The expectation matching circuit 41 checks if the DQ signal Nd14 which is captured into the capture circuit 12 matches with an expected value and thereby determines whether the reading of the DQ signal is a success or not. If the variable delay amount is so small that the DQ signal is captured prior to a setup limit, the reading of the DQ signal results in failure. If the DQ signal is captured within a data valid window after the setup time, the DQ signal matches with an expected value. If the delay amount is so large that the DQ signal is captured within a hold time, the reading of the DQ signal results in failure again. A setup limit and a hold limit can be detected based on the expectation matching result in the expectation matching circuit 41.

In this manner, the delay adjustment circuit 14 obtains an optimum delay amount of a DQS signal so as to capture a DQ signal at the center of a data valid window where a timing margin is maximum by searching for a setup/hold limit delay while changing a delay amount of a variable delay circuit and determining its center just like the related art.

The delay amount calculation circuit 42 detects a setup limit and a hold limit based on the expectation matching and calculates optimum data capture timing in the capture circuit 12. The delay setting circuit 43 sets the optimum delay amount calculated in the delay amount calculation circuit 42 to the variable delay circuit 13 so as to generate a DQS signal which rises at the optimum data capture timing which is calculated in the delay amount calculation circuit 42.

The interface circuit 10 of this embodiment includes the fixed delay circuit 11 to thereby generate a DQ signal Nd13 by adding a prescribed delay amount to the DQ signal Nd12. Because the interface circuit 10 calculates an optimum delay amount by performing delay adjustment with the use of the delayed DQ signal, it is possible to detect a setup limit even if a clock frequency is high.

Figure 2:
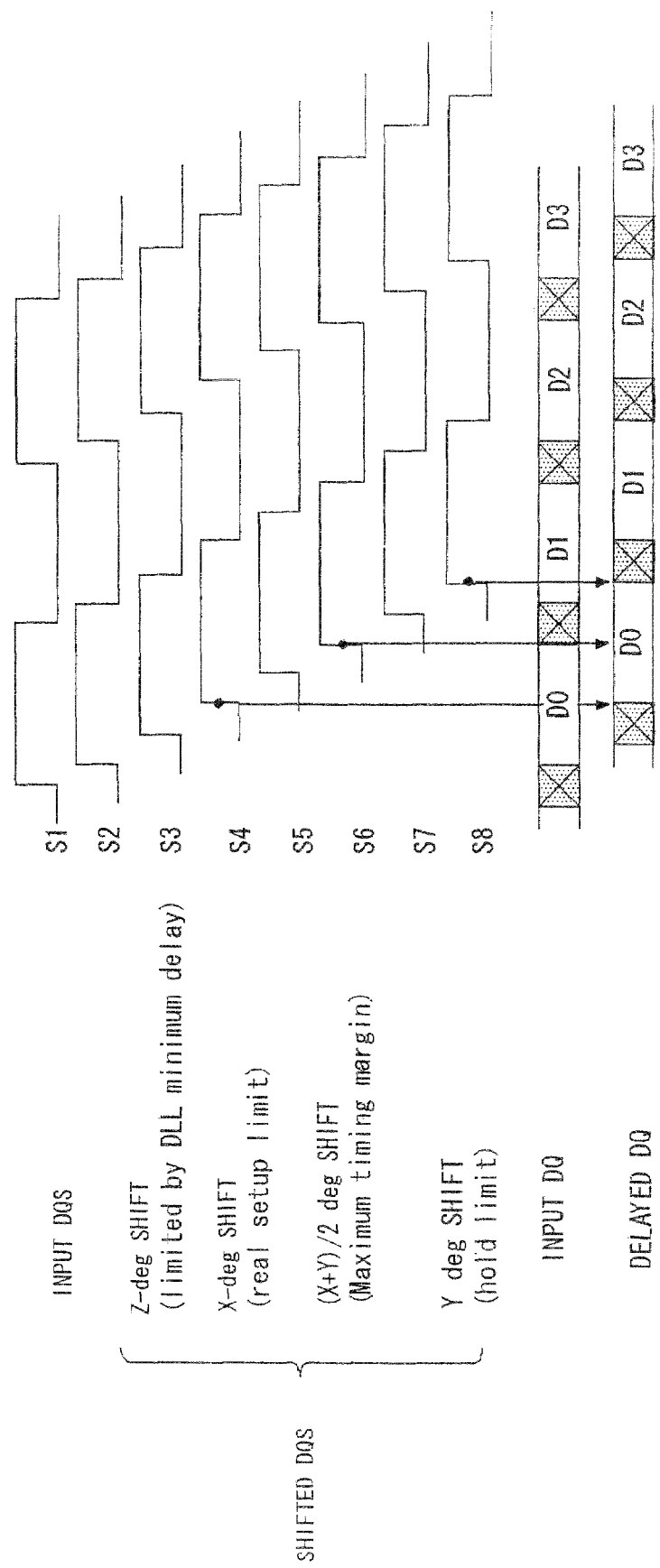
FIG. 2 is a timing chart showing a DQ signal and a DQS signal that are input to the interface circuit according to the first embodiment of the present invention.

The delay adjustment operation of the interface circuit according to this embodiment is described hereinafter. FIG. 2 is a timing chart showing DQ signals and DQS signals in each timing. Shifted DQS signals S2 to S7 indicate delayed DQS signals with a different delay amount (different phase amount) which are generated in the variable delay circuit 13. Although a shifted DQS signal S2 is required to detect a setup limit of an input DQ signal in this example, a Z-deg DQS signal S3 with a minimum delay amount of the variable delay circuit 13 has a larger delay amount than the shifted DQS signal S2. Thus, the rising edge of the Z-deg DQS signal S3 with a minimum delay is later than the setup limit of the input DQ signal and therefore it is unable to detect a setup limit of the input DQ signal.

In view of the foregoing, an input DQ signal is a delayed DQ signal to which a prescribed amount of delay is added by the fixed delay circuit 11 in this embodiment. The delay amount is set in such a way that a setup limit of a delayed DQ signal is later than a rising edge of a Z-deg DQS signal with a minimum delay as described in detail later. In the example of FIG. 2, a setup limit of a delayed DQ signal is later than a minimum delay amount (=Z-deg), and therefore the setup limit corresponds to a X-deg shift S4. It is thereby possible to detect the setup limit. In the example of FIG. 2, a shifted DQS signal S7 which is shifted by Y-deg is a hold limit. Accordingly, an optimum delay amount is determined as (X+Y)/2 deg.

Figure 3:
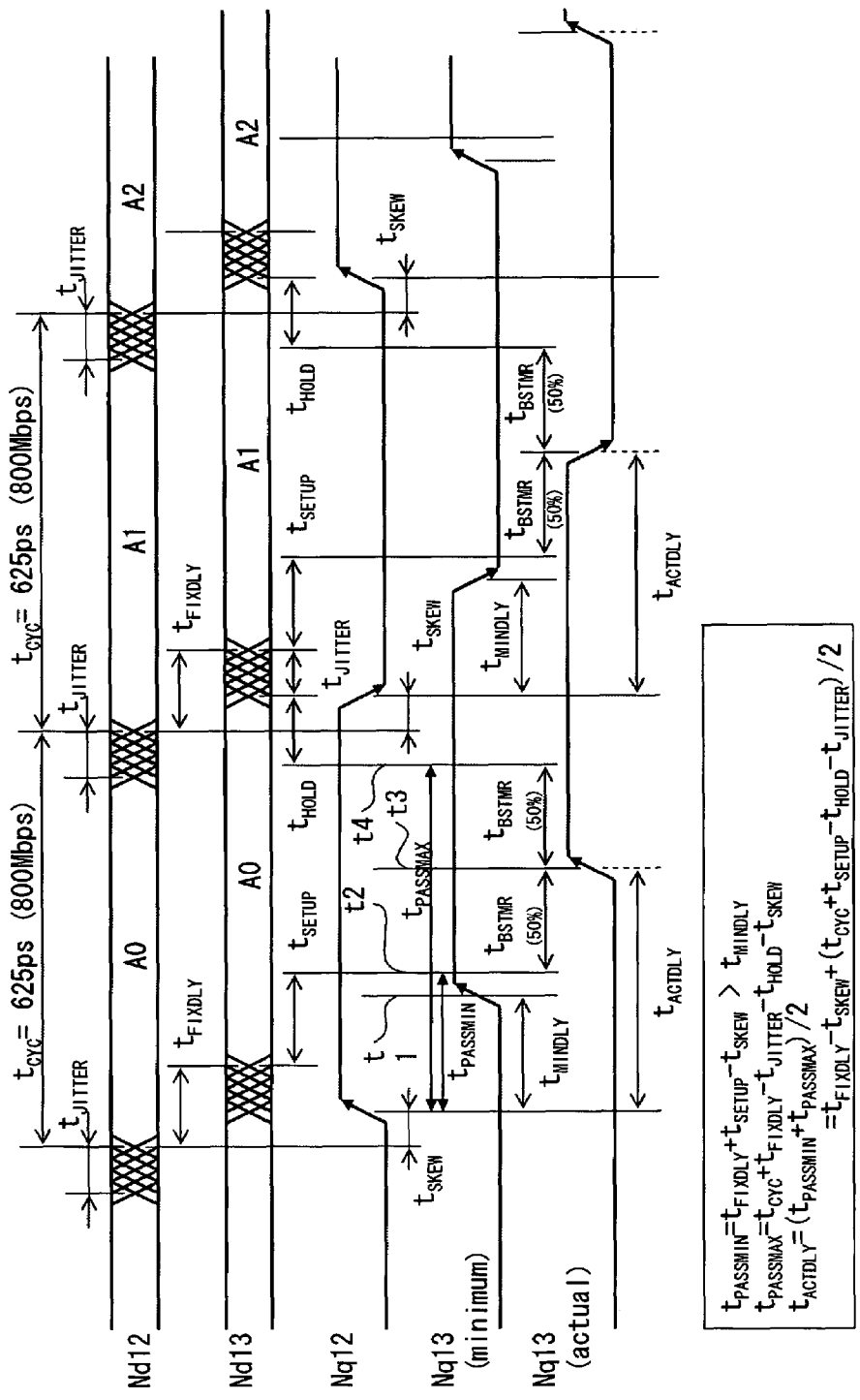
FIG. 3 is a timing chart showing DQ signals Nd12, Nd13 and DQS signals Nq12, Nq13 in the interface circuit according to the first embodiment of the present invention.

A fixed delay amount of the delayed DQ signal is described in detail hereinbelow. FIG. 3 is a timing chart showing DQ signals Nd12, Nd13 and DQS signals Nq12, Nq13.

The DQ signal Nd12 and the DQS signal Nq12 are a DQ signal and a DQS signal which are input to the fixed delay circuit 11 and the variable delay circuit 13, respectively. Although the DQ signal Nd11 and the DQS signal Nq11 are output from the DDR-SDRAM 3 at substantially the same timing, they become out of phase due to a difference in line length or the like until they are input to the DQ terminal 21 and the DQS terminal 22, respectively, of the semiconductor integrated circuit 2; as a result, they have a different delay amount as shown in DQ Nd12 and DQS Nq12 with a delay difference of $t_{SKEW}$.

$t_{CYC}$: Cycle of DQ signal $t_{JITTER}$: Length of jitter of DQ signal $t_{FIXDLY}$: Delay amount of fixed delay circuit 11

$t_{SETUP}$: Setup time $t_{HOLD}$: Hold time $t_{SKEW}$: Skew time between DQ signal and DQS signal $t_{PASSMIN}$: Minimum delay amount (setup limit)

$t_{PASSMAX}$: Maximum delay amount (hold limit)

$t_{MINDLY}$: Minimum delay amount of variable delay circuit $t_{BSTMR}$: ½ ($t_{PASSMAX} - t_{PASSMIN}$)

$t_{ACTDLY}$: Actual delay amount where $$t_{PASSMIN} = t_{FIXDLY} + t_{SETUP} - t_{SKEW} > t_{MINDLY} \quad (1)$$

$$t_{PASSMAX} = t_{CYC} + t_{FIXDLY} - t_{JITTER} - t_{HOLD} - t_{SKEW} \quad (2)$$

$$t_{ACTDLY} = (t_{PASSMIN} + t_{PASSMAX})/2 \quad (3)$$
$$= t_{FIXDLY} + t_{SKEW} + (t_{CYC} + t_{SETUP} - t_{HOLD} - t_{JITTER})/2$$

The case where the DQS signal Nq12 is delayed behind the DQ signal Nd12 by the amount of $t_{SKEW}$ due to a skew because of a difference in line length between the DDR-SDRAM 3 and the semiconductor integrated circuit 2 or the like is described hereinafter. The DQ signal Nd12 becomes the DQ signal Nd13 with a delay of $t_{FIXDLY}$ by the fixed delay circuit 11. The DQS signal Nq13 (actual) is a DQS signal after optimum delay amount adjustment, and the DQS signal Nq13 (minimum) is a DQS signal having a minimum delay amount $t_{MINDLY}$ of the variable delay circuit. The rising edge t1 of the DQS signal Nq13 (minimum) with a minimum delay amount $t_{MINDLY}$ is earlier than a setup limit t2.

It is necessary to set a delay amount of a DQS signal Nq13 to the variable delay circuit 13 in such a way that the rising edge of the DQS signal Nq13 is at the center of a data valid window in which a jitter $t_{JITTER}$, a setup time $t_{SETUP}$, and a hold time $t_{HOLD}$ are subtracted from a data cycle $t_{CYC}$, as shown in the DQS signal Nq13 (actual) in FIG. 3.

Therefore, it is necessary to detect a setup limit t2 which is the setup end timing and a hold limit t4 which is the hold start timing in the DQ signal Nd12. In order to detect the timing t2 and t4, a delay of the variable delay circuit 13 is varied within a prescribed delay width and checked against an expected value. In the timing before t2, the expectation matching results in failure. Within a data valid window from the timing t2 to t4, data is readable and it matches with an expected value. After the timing t4, the expectation matching results in failure again.

The timing t2 and t4 are detected by sequentially changing a delay amount and performing expectation matching. The intermediate timing t3 between the timing t2 and t4 is the ideal delay timing of the DQS signal (Nq13 (actual)). To calculate this, a minimum pass delay $t_{PASSMIN}$ from the rising edge of the DQS signal Nq12 input to the variable delay circuit 13 to the timing t2 is calculated using the equation (1) described above. Then, a maximum pass delay $t_{PASSMAX}$ from the rising edge of the DQS signal Nq12 to the timing t4 is calculated using the above-described equation (2). Further, a delay amount $t_{ACTDLY}$ which is actually set to the variable delay circuit 13 is calculated using the above-described equation (3).

In this embodiment, $t_{PASSMIN} > t_{MINDLY}$ is satisfied. Thus, the minimum delay timing t1 of the variable delay circuit 13 is always earlier than the setup limit t2. It is thereby possible to detect the setup limit t2 without fail. To this end, the interface circuit 10 of this embodiment includes the fixed delay circuit 11 in which $t_{FIXDLY}$ is set so as to satisfy $t_{PASSMIN} > t_{MINDLY}$. From the above-described equation (1), $t_{FIXDLY} > t_{MINDLY} + t_{SKEW} - t_{SETUP}$ is satisfied.

Specifically, a delay amount of the fixed delay circuit 11 is set to be larger than a time which is a result of subtracting a setup time $t_{SETUP}$ from a minimum delay amount $t_{MINDLY}$ of the variable delay circuit 13 and a skew $t_{SKEW}$. Although $t_{SKEW}$ is described as a skew between a DQ signal and a DQS signal in this embodiment, if there are eight DQ signals for a DQS signal, for example, $t_{SKEW}$ includes each skew between those DQ signals. Because it is possible to estimate the amount of $t_{SKEW}$ or the like based on the standard technological level, the fixed delay amount can be set according to these values so as to satisfy $t_{PASSMIN} > t_{MINDLY}$ with some margin.

In this embodiment, a DQ signal is delayed so that the timing of a minimum delayed DQS signal Nq13 of the variable delay circuit 13 is earlier than the setup limit t2, thereby enabling detection of a setup limit even if a clock frequency is high. It is therefore possible to calculate an accurate optimum delay amount and set an optimum delay amount properly. This significantly reduces the probability of a failure in reading of a DQ signal, thus providing a highly reliable semiconductor device even with a DDR-SDRAM having a high operating frequency such as DDR2-800 and DDR3.

Second Embodiment

Figure 4:
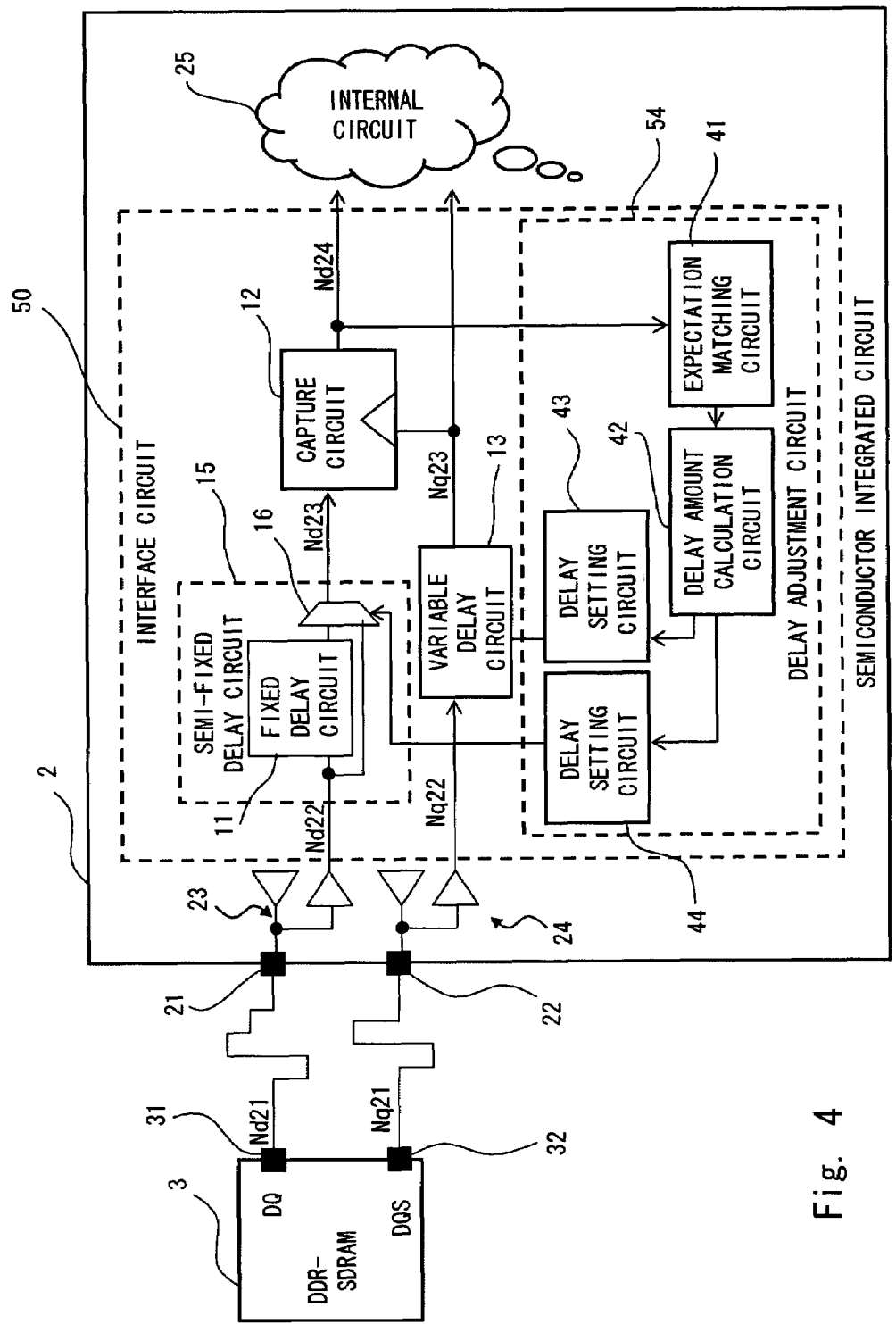
FIG. 4 is a block diagram showing a semiconductor integrated circuit that includes an interface circuit according to a second embodiment of the present invention.

A second embodiment of the present invention is described hereinafter. FIG. 4 is a block diagram showing a semiconductor device according to this embodiment. The same elements as in the semiconductor device of FIG. 1 are denoted by the same reference numerals and not described in detail herein.

In an interface circuit 50 of this embodiment, a selector 16 for bypassing the fixed delay circuit 11 is added. The interface circuit 50 includes a semi-fixed delay circuit 15 which is composed of the fixed delay circuit 11 and the selector 16. Further, a delay adjustment circuit 54 includes a delay setting circuit 44 for controlling the selector 16, in addition to the expectation matching circuit 41, the delay amount calculation circuit 42 and the delay setting circuit 43.

The interface circuit 50 of this embodiment uses a DQ signal which is delayed by the fixed delay circuit 11 during the calibration operation just like the first embodiment. During the normal operation, on the other hand, it inputs a DQ signal directly to the capture circuit 12 without passing through the fixed delay circuit 11, thereby eliminating the latency of the capture timing of a DQ signal.

Figure 5:
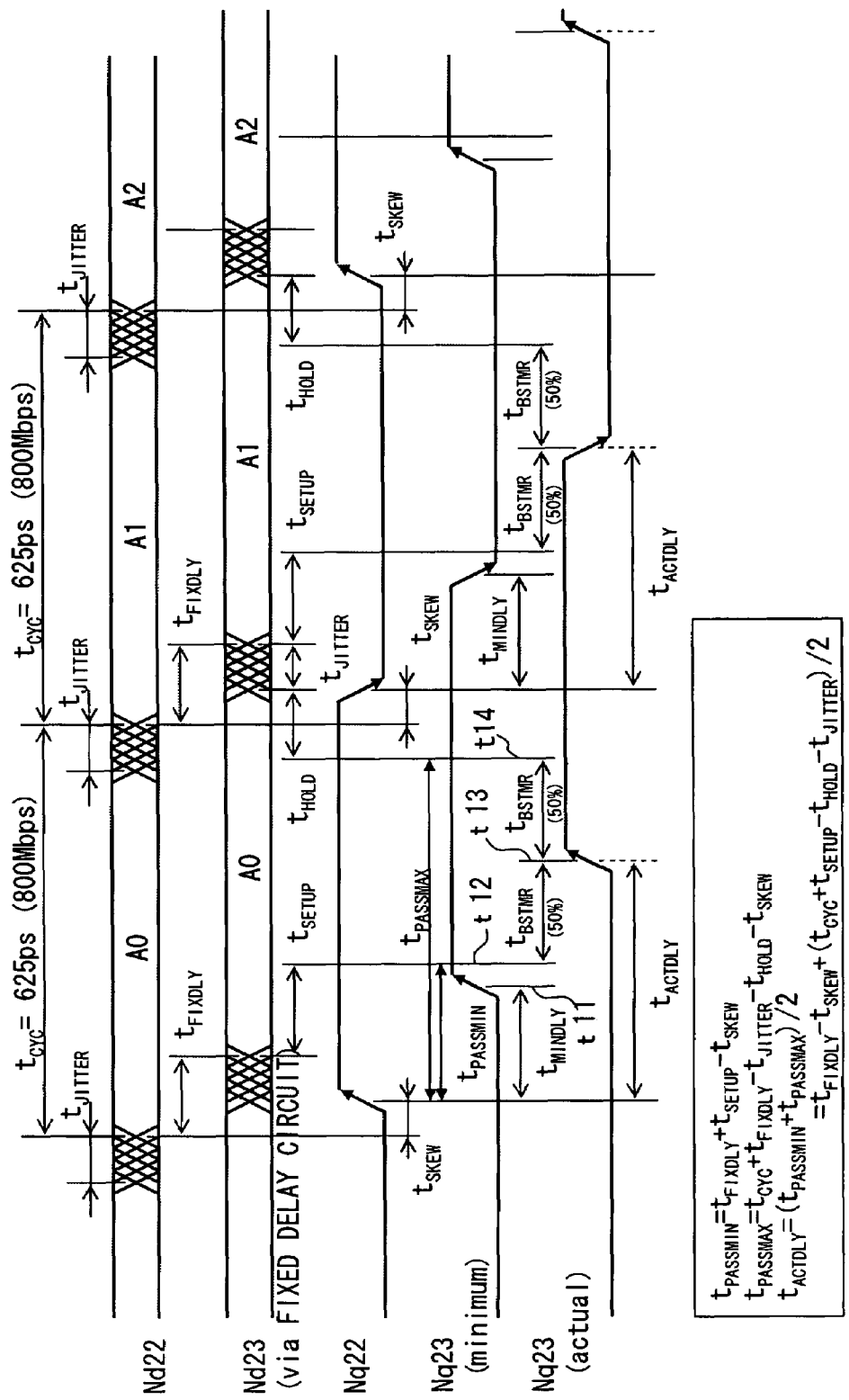
FIG. 5 is a timing chart showing DQ signals and DQS signals where a signal passes through a fixed delay circuit in the interface circuit according to the second embodiment of the present invention.
Figure 6:
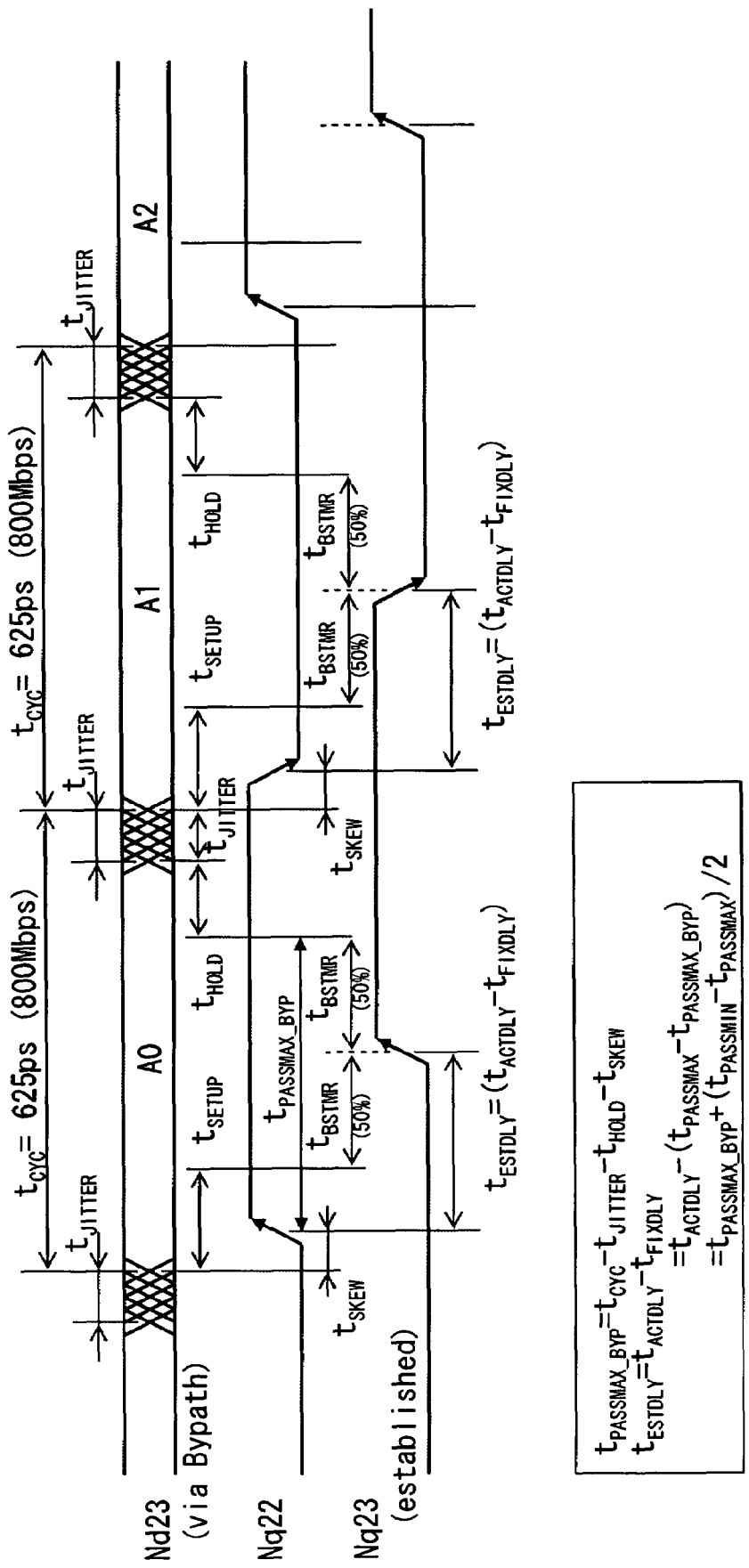
FIG. 6 is a timing chart showing DQ signals and DQS signals where a signal bypasses a fixed delay circuit in the interface circuit according to the second embodiment of the present invention.

FIGS. 5 and 6 are timing charts showing DQ signals Nd22, Nd23 and DQS signals Nq22 and Nq23. In the calibration operation, a path that passes through the fixed delay circuit 11 is selected to search for the delay setting ($t_{PASSMIN}$) with its limit being at setup (t12) and the delay setting ($t_{PASSMAX}$) with its limit being at hold (t14). The actual delay setting ($t_{ACTDLY}$) is the same as that in the first embodiment in this case.

Specifically, a DQ signal Nd22 which is input to the interface circuit 50 passes through the fixed delay circuit 11 and becomes a delayed signal Nd23 having a fixed delay amount of $t_{FIXDLY}$. A DQS signal (Nd22) is input to the interface circuit 50 earlier than the DQ signal by $t_{SKEW}$ due to a skew or the like. The variable delay circuit 13 shifts a delay amount and searches for a setup limit and a hold limit to obtain an actual delay amount $t_{ACTDLY}$.

Then, the delay setting circuit 44 switches the selector 16 to select a path that bypasses the fixed delay circuit 11 to search for the delay setting with its limit being at hold. A delay amount $t_{FIXDLY}$ of the fixed delay circuit 11 can be obtained by comparing the hold limits when passing through the fixed delay circuit 11 and when not passing through the fixed delay circuit 11. Just like the first embodiment, a fixed delay amount of the fixed delay circuit 11 is set to be larger than a time which is a result of subtracting a setup time $t_{SETUP}$ from a minimum delay amount $t_{MINDLY}$ of the variable delay circuit 13 and a skew $t_{SKEW}$. An accurate fixed delay amount can be obtained by such measurement.

In FIG. 6, $t_{PASSMAX\_BYP}$ is a maximum delay amount when not passing through the fixed delay circuit 11, and $t_{ESTDLY}$ is a delay amount to be set to the variable delay circuit 13. They can be calculated as follows:

$$t_{PASSMAX\_BYP} = t_{CYC} - t_{JITTER} - t_{HOLD} - t_{SKEW} \quad (4)$$

$$\begin{aligned} t_{ESTDLY} &= t_{ACTDLY} - t_{FIXDLY} \\ &= t_{ACTDLY} - (t_{PASSMAX} - t_{PASSMAX\_BYP}) \\ &= t_{PASSMAX\_BYP} + (t_{PASSMIN} - t_{PASSMAX\_BYP})/2 \end{aligned} \quad (5)$$

In this way, a delay amount $t_{ESTDLY}$ is obtained by subtracting a fixed delay amount $t_{FIXDLY}$ from $t_{ACTDLY}$ which is expressed by the equation (3) and it is set as a delay amount of the variable delay circuit 13.

Figure 7:
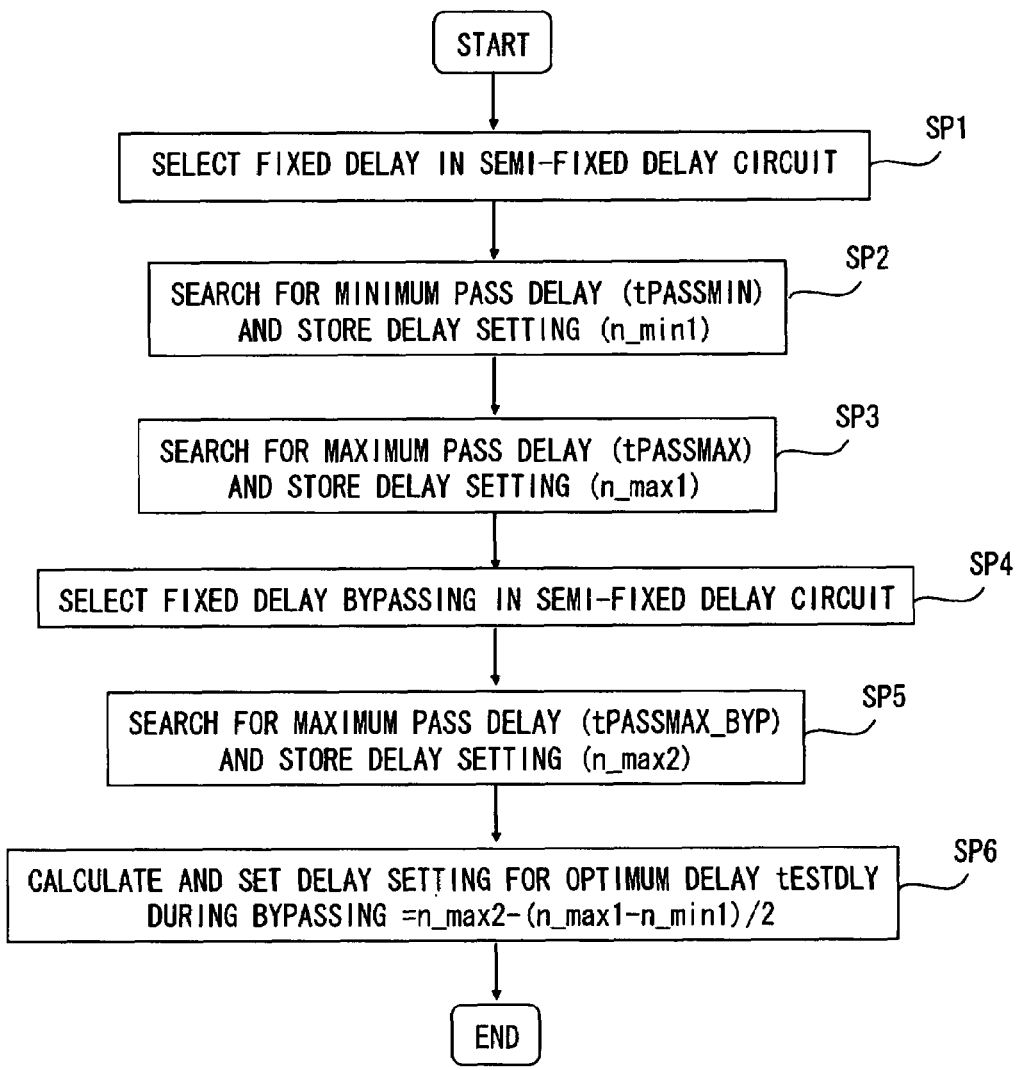
FIG. 7 is a flowchart showing a delay amount search method according to the second embodiment of the present invention.

FIG. 7 is a flowchart showing a delay amount search method according to this embodiment. As shown in FIG. 7, the process first selects a path that passes through the fixed delay circuit 11 in the semi-fixed delay circuit 15 (Step SP1). It then searches for a minimum pass delay ($t_{PASSMIN}$) and stores the delay setting (n_min1) (Step SP2). $t_{PASSMIN}$ is a delay amount which first matches with an expected value in the expectation matching circuit 41 while sequentially shifting a delay amount from a minimum delay amount $t_{MINDLY}$ in the variable delay circuit 13.

Then, the process searches for a maximum pass delay ($t_{PASSMAX}$) and stores the delay setting (n_max1) (Step SP3). $t_{PASSMAX}$ is a delay amount which is immediately before the delay amount that first mismatches with an expected value in the expectation matching circuit 41 while further increasing a delay amount from $t_{PASSMIN}$.

Then, the process switches the selector 16 by the delay setting circuit 44 to select a path that bypasses the fixed delay circuit 11 (Step SP4). It then searches for a maximum pass delay ($t_{PASSMAX\_BYP}$) in this path and stores it (Step SP5). Based on the above results, the process calculates an optimum delay $t_{ESTDLY}$ during bypassing in the delay amount calculation circuit 42 from the following equation (6):

$$t_{ESTDLY} = n\_max1 - (n\_min1 - n\_min2) \quad (6)$$

The delay is set to the variable delay circuit 13 by the delay setting circuit 43 (Step SP6).

This embodiment not only enables to obtain an optimum delay amount of a variable delay circuit by delaying a DQ signal using the fixed delay circuit 11 to allow setup limit search, but also enables to prevent a delay in a DQ signal during normal operation by bypassing the fixed delay circuit 11.

Third Embodiment

Figure 8:
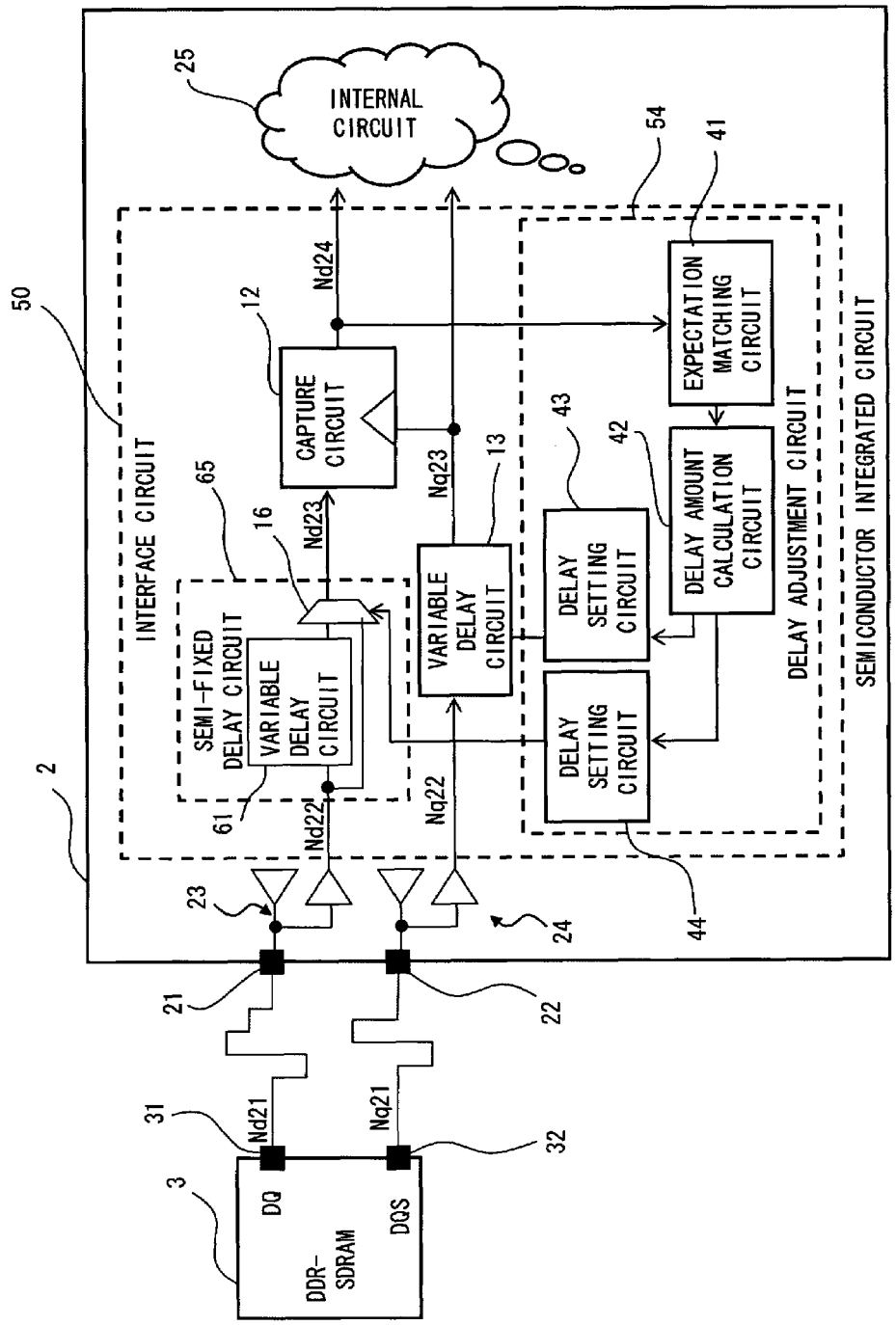
FIG. 8 is block diagram showing a semiconductor integrated circuit that includes an interface circuit according to a third embodiment of the present invention.

A third embodiment of the present invention is described hereinafter. FIG. 8 is a block diagram showing a semiconductor device according to the third embodiment of the present invention. In FIG. 8, the same elements as in the semiconductor device of FIG. 4 are denoted by the same reference numerals and not described in detail herein. As shown in FIG. 8, the above-described semi-fixed delay circuit 15 is replaced with a semi-fixed delay circuit 65 which is composed of a variable delay circuit 61 and the selector 16 in this embodiment. Although a delay amount of a DQ signal is a fixed delay amount satisfying $t_{PASSMIN} > t_{MINDLY}$, which is, a fixed delay amount $t_{FIXDLY} > t_{MINDLY} + t_{SKEW} - t_{SETUP}$, in the first and second embodiments, the value of $t_{MINDLY}$ is variable in this embodiment.

When setting a fixed delay amount, the fixed delay amount is determined so as to satisfy $t_{PASSMIN} > t_{MINDLY}$ with some margin, and the amount of $t_{SKEW}$ or the like is estimated based on the standard technological level. Because $t_{SKEW}$ varies by DIMM or DRAM, a slightly large value of $t_{MINDLY}$ is set.

However, there are cases where the amount of $t_{SKEW}$ is larger than estimated and thereby the fixed delay amount $t_{FIXDLY}$ does not satisfy the above expression. A DQS signal which is output from a memory is not a continuous signal like a clock signal but a signal that is added only when there is a DQ signal to be read. Thus, if $t_{SKEW}$ is large, $t_{FIXDLY}$ should be large accordingly. However, because a large fixed delay amount generally causes an increase in error, it is preferred to set an optimum fixed delay amount. To this end, this embodiment prepares several delay amounts which can be selected as a delay amount of a DQ signal for calibration.

This configuration allows increasing a fixed delay amount to enable accurate calibration when a fixed delay amount is too small to detect a setup limit, and also allows preventing a fixed delay amount from being too large to thereby enable more accurate calibration.

Figure 9:
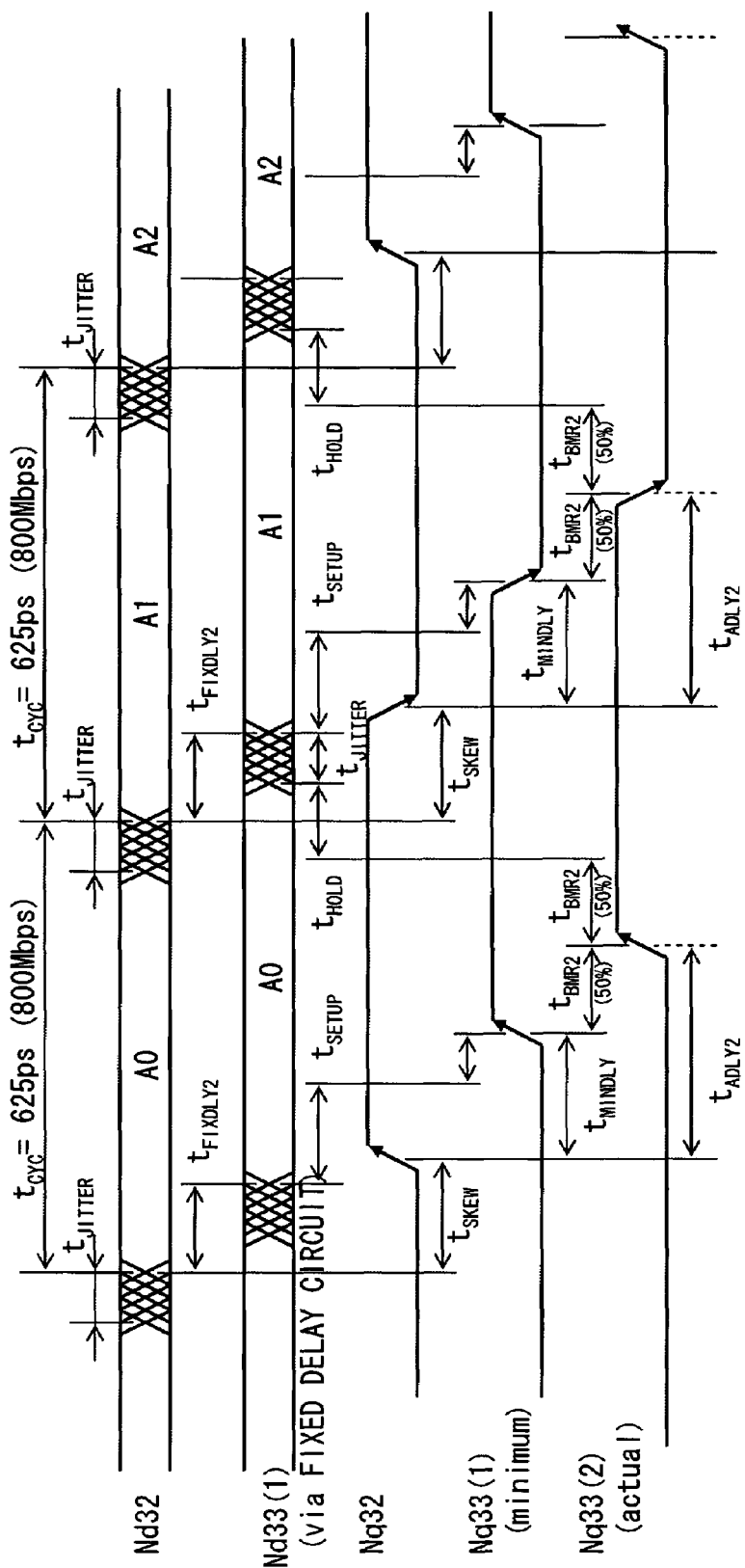
FIG. 9 is a timing chart showing DQ signals and DQS signals where a signal passes through a delay circuit with a delay amount of $t_{FIXDLY2}$ in the interface circuit according to the third embodiment of the present invention.
Figure 10:
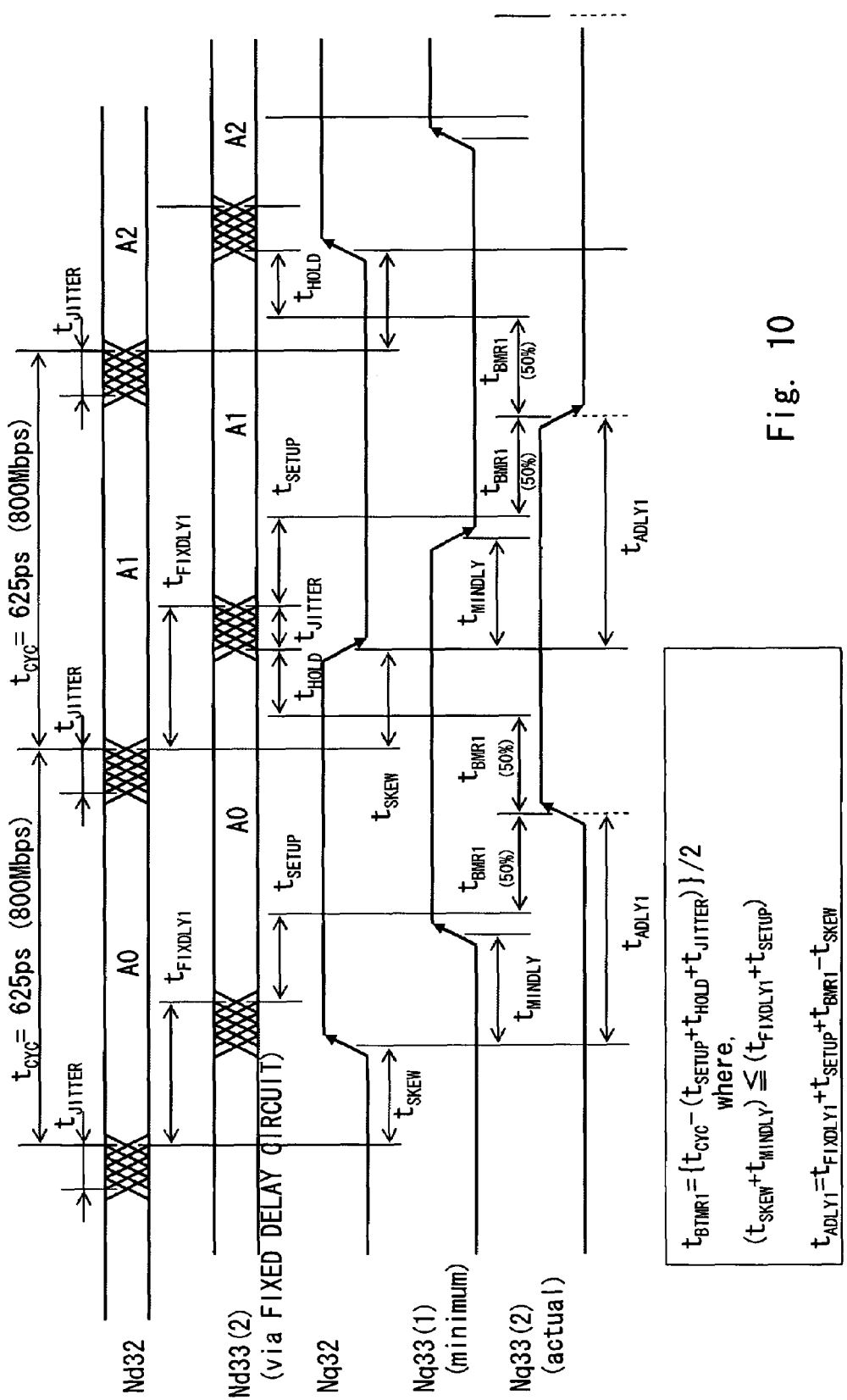
FIG. 10 is a timing chart showing DQ signals and DQS signals where a signal passes through a delay circuit with a delay amount of $t_{FIXDLY1}$ in the interface circuit according to the third embodiment of the present invention.
Figure 11:
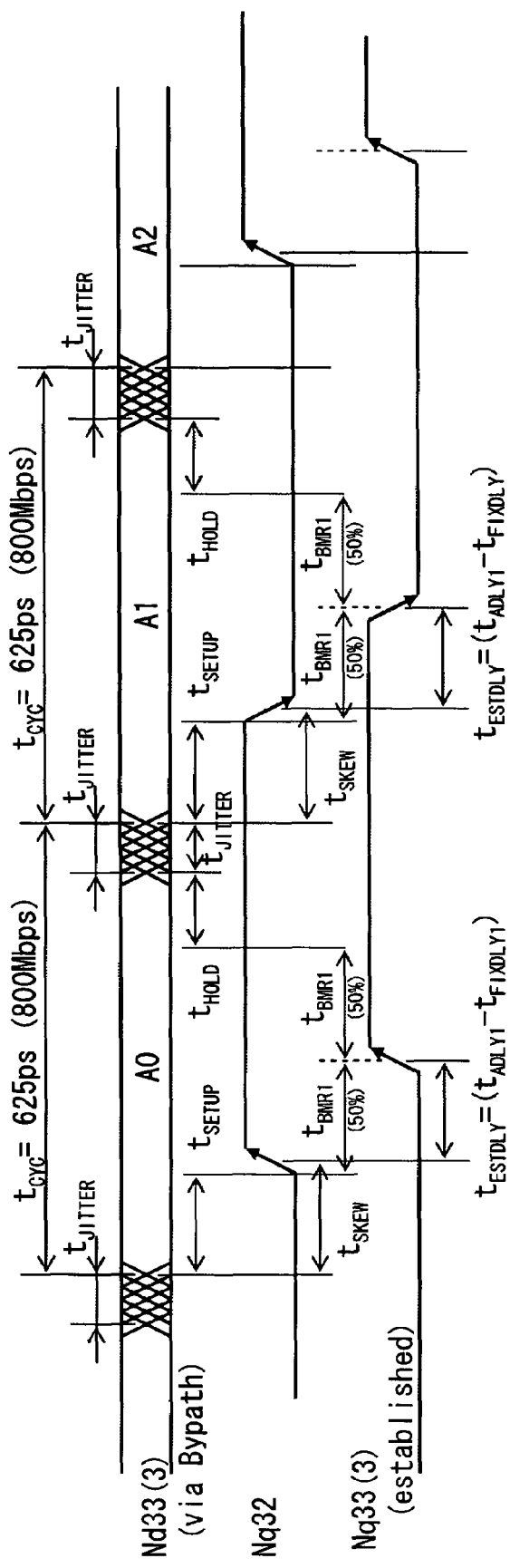
FIG. 11 is a timing chart showing DQ signals and DQS signals where a signal bypasses a delay circuit in the interface circuit according to the third embodiment of the present invention.

FIGS. 9 to 11 are timing charts showing a DQ signal Nd32 which is input to the semi-fixed delay circuit 65, a DQ signal Nd33 which is output from the semi-fixed delay circuit 65, a DQS signal Nq32 which is input to the variable delay circuit 13, and a DQS signal Nq33 which is output from the variable delay circuit 13.

In FIG. 9, Nd33(1) is a DQ signal which is set to a delay amount of $t_{FIXDLY2}$ after passing through the variable delay circuit 61, and Nq33(1) is a DQS signal which is set to a minimum delay amount of $t_{MINDLY}$ by the variable delay circuit 13, and Nq33 (2) is a DQS signal which is set to a delay amount of $t_{ADLY2}$ by the variable delay circuit 13 as a result of calibration using Nd33(1). Because the fixed delay amount $t_{FIXDLY2}$ of Nd33(1) is small, the rising edge of Nq33(1) is earlier than a setup limit, thus being unable to calculate an accurate optimum delay amount.

In view of the foregoing, a delay amount of a DQ signal is set to $t_{FIXDLY1}$, which is larger than $t_{FIXDLY2}$. As shown in FIG. 10, a setup limit of the DQ signal Nq33 (2) is larger than the DQS signal Nq33(1) with a minimum delay amount, thus being able to detect a setup limit. Then, a path that does not pass through the variable delay circuit 61 is selected and a hold limit is searched for as shown in FIG. 11, thereby calculating a delay amount $t_{FIXDLY1}$ which is set to the variable delay circuit 61. A delay amount $t_{ESTDLY}$ of the variable delay circuit 13 to be set to a DQS signal can be thus calculated as follows:

$$t_{ESTDLY} = t_{ADLY1} - t_{FIXDLY1}$$

Figure 12:
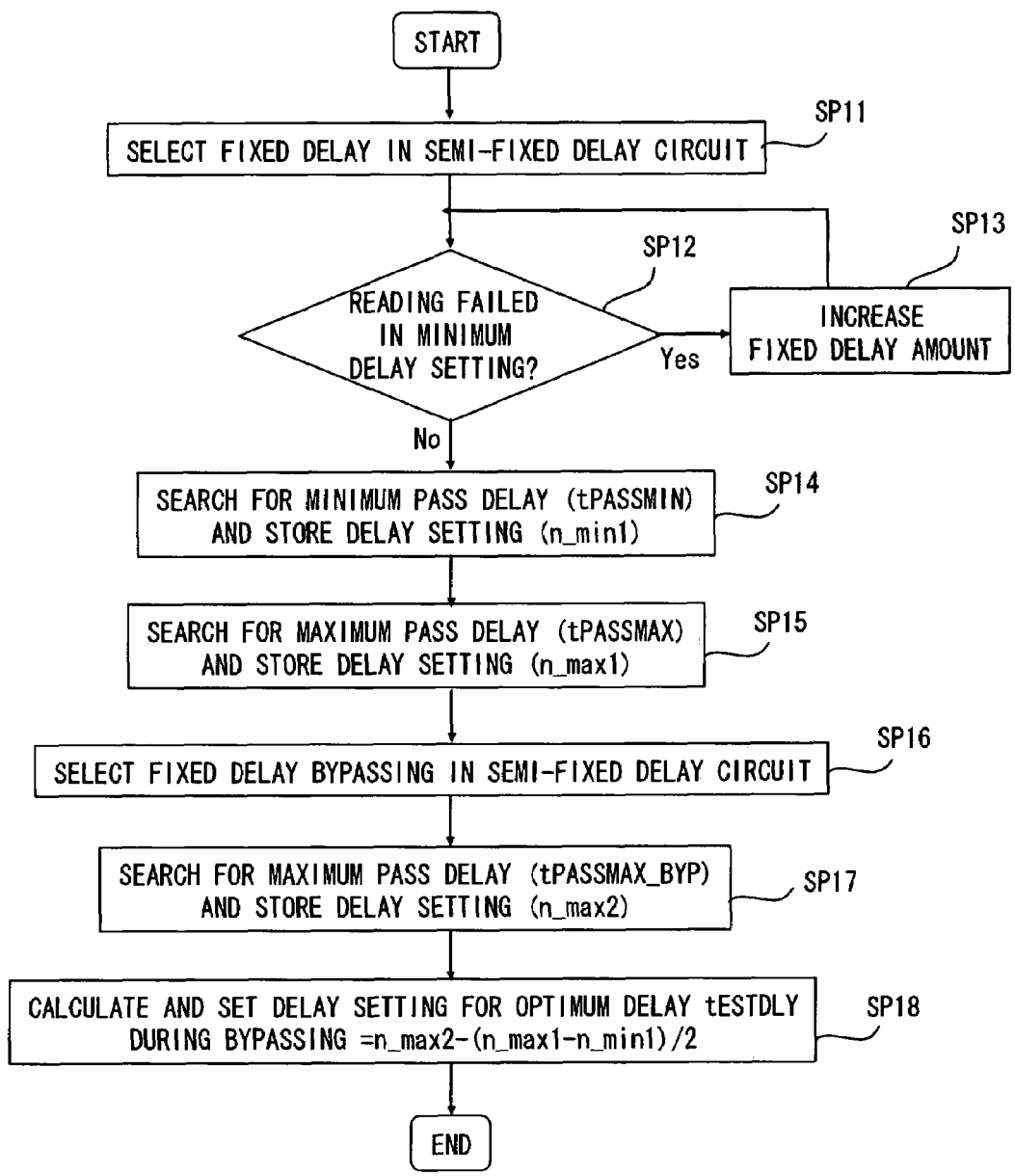
FIG. 12 is a flowchart showing a delay amount search method according to the third embodiment of the present invention.
Figure 13:
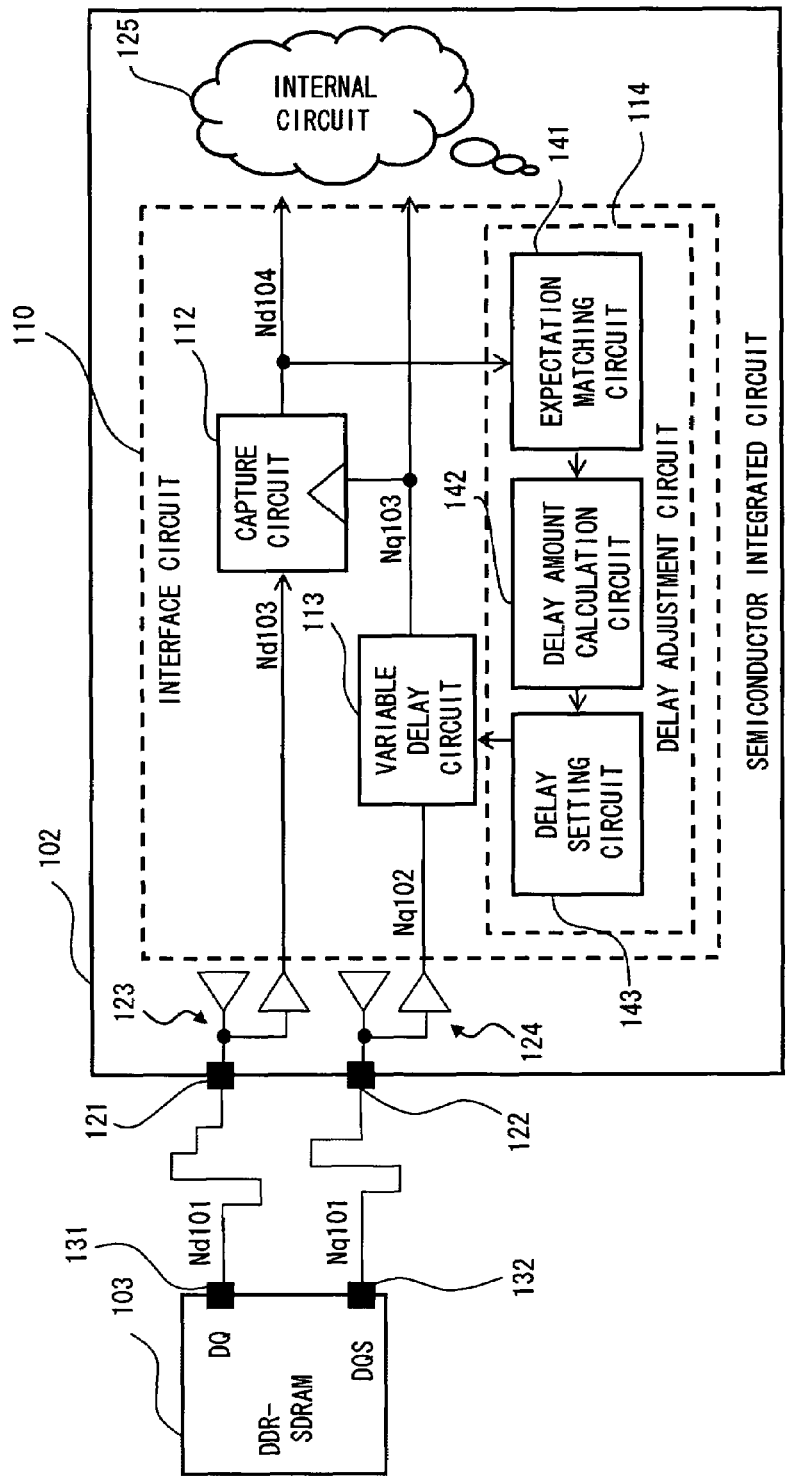
FIG. 13 is a view showing a DDR-SDRAM and its interface circuit according to a related art.
Figure 14:
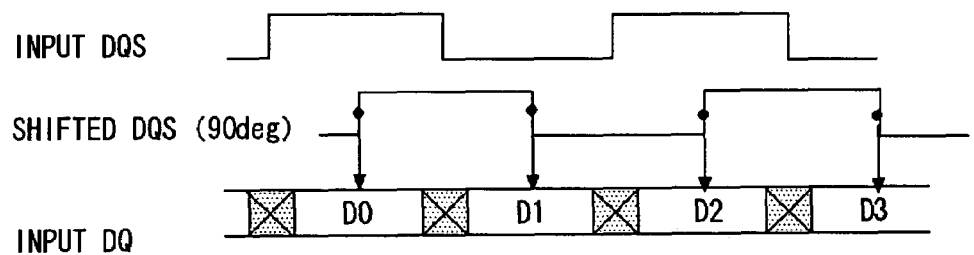
FIG. 14 is a view showing a DQ signal and a DQS signal which is phase-shifted by 90 degrees.
Figure 15:
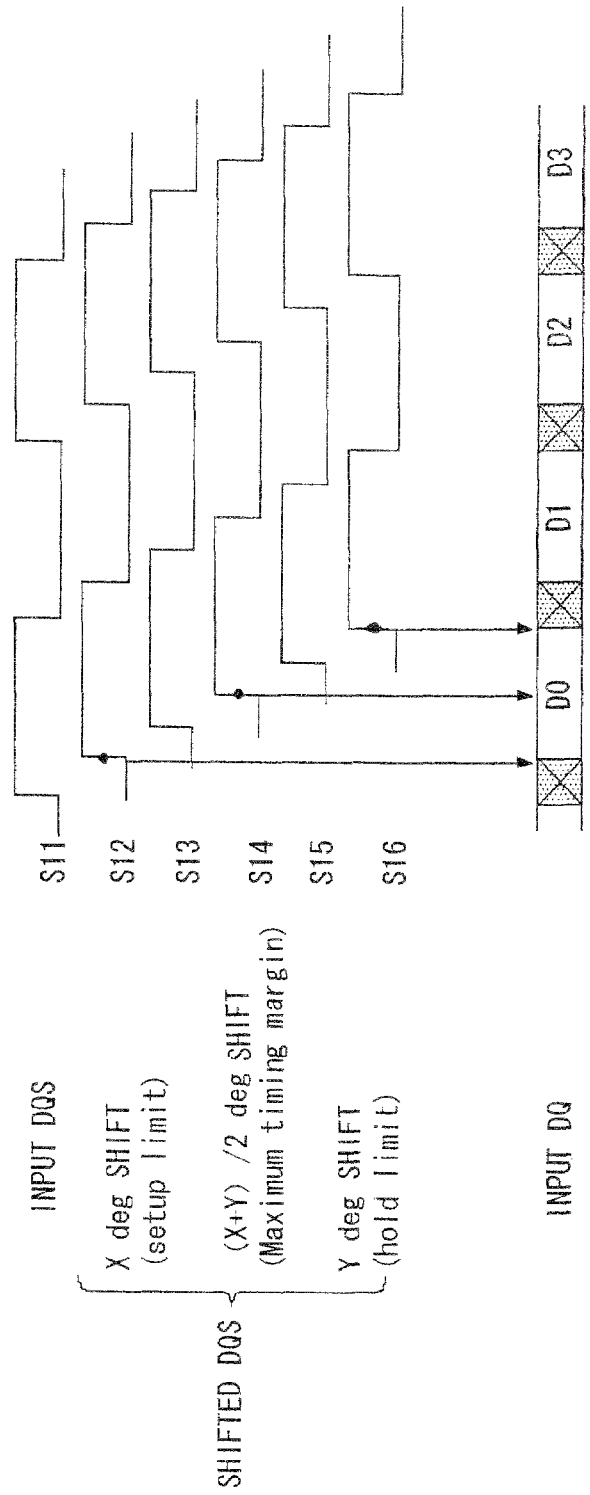
FIG. 15 is a view to describe a delay adjustment method disclosed in Sekiguchi et al.
Figure 16:
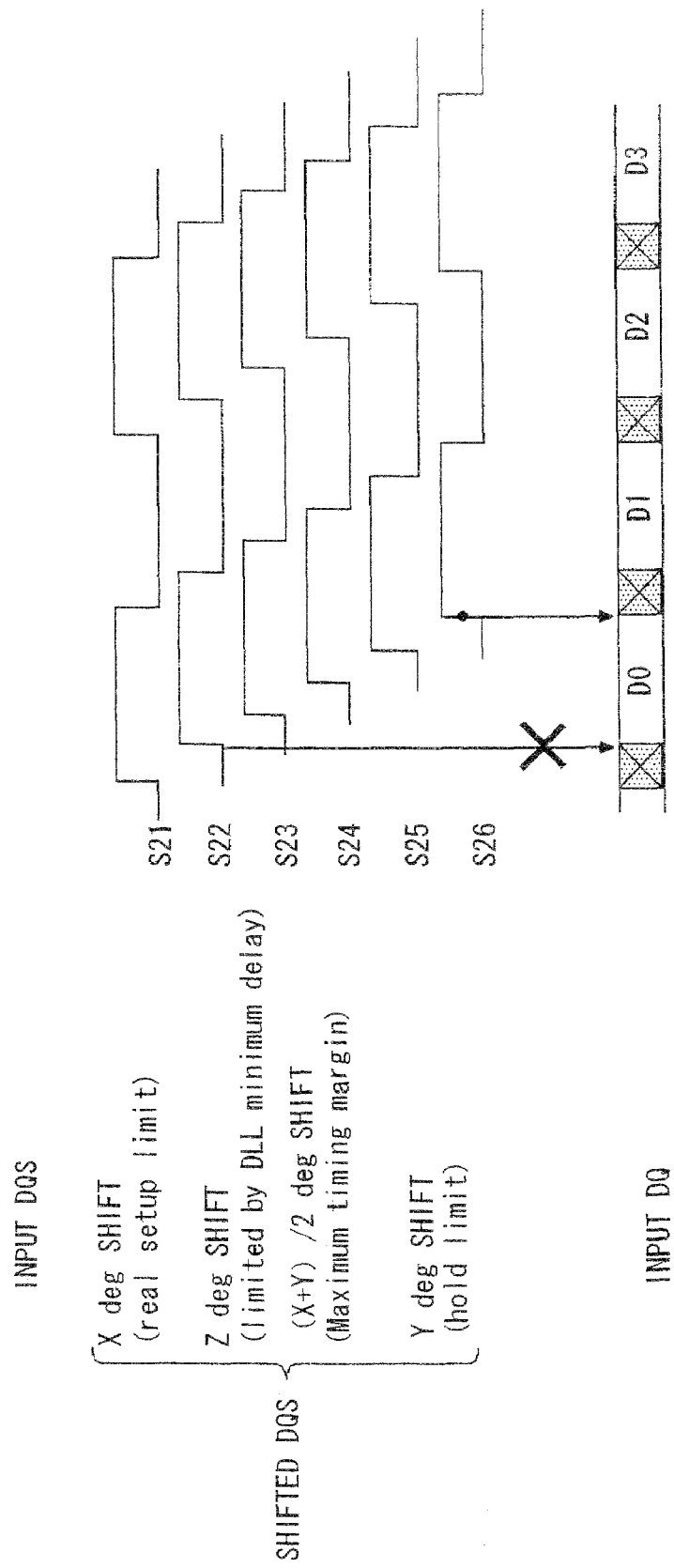
FIG. 16 is a view to describe a problem of the delay adjustment method according to the related art.
Figure 17:
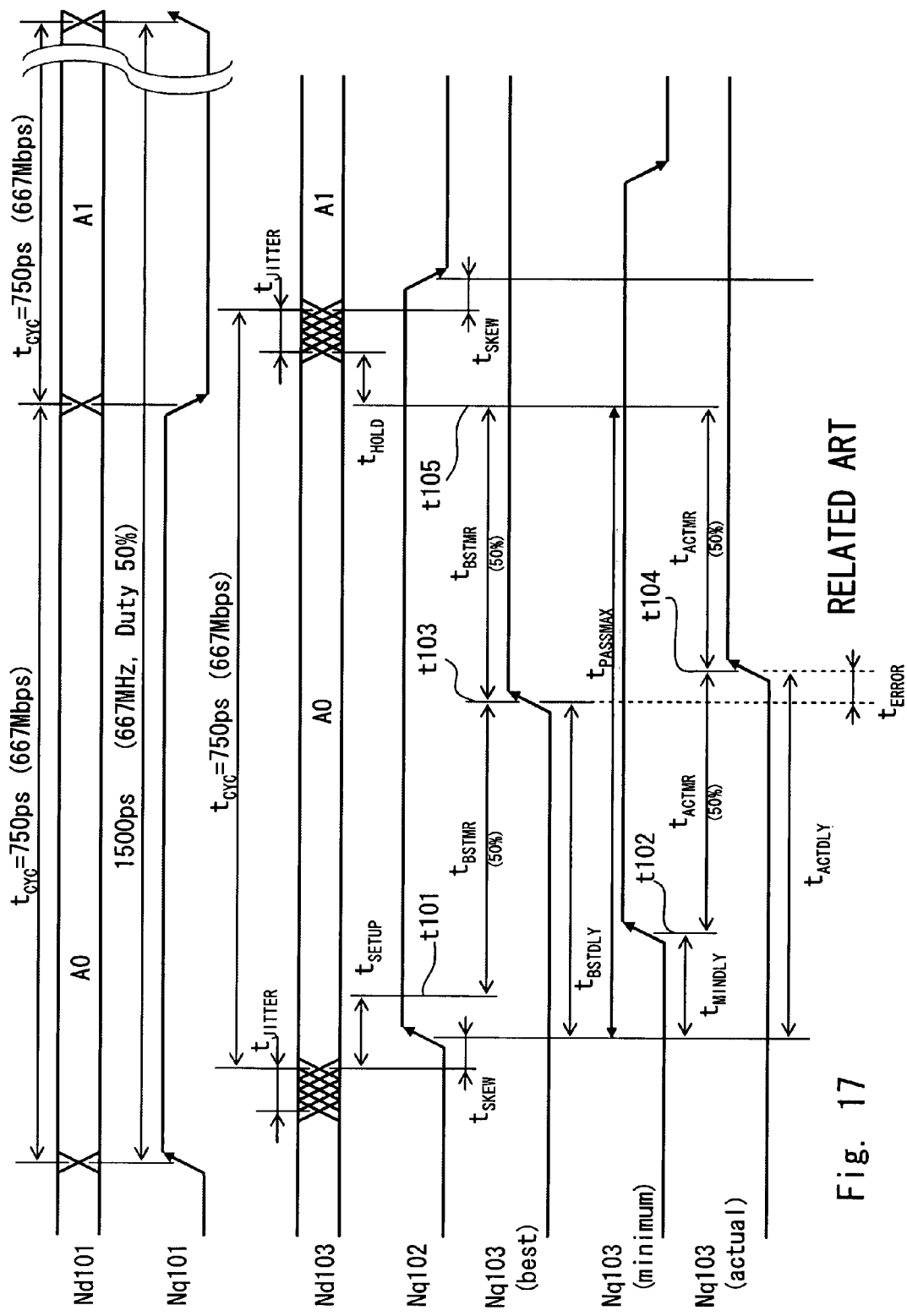
FIG. 17 is a view to describe a delay adjustment method according to the related art where a data transfer speed is 667 Mbps.
Figure 18:
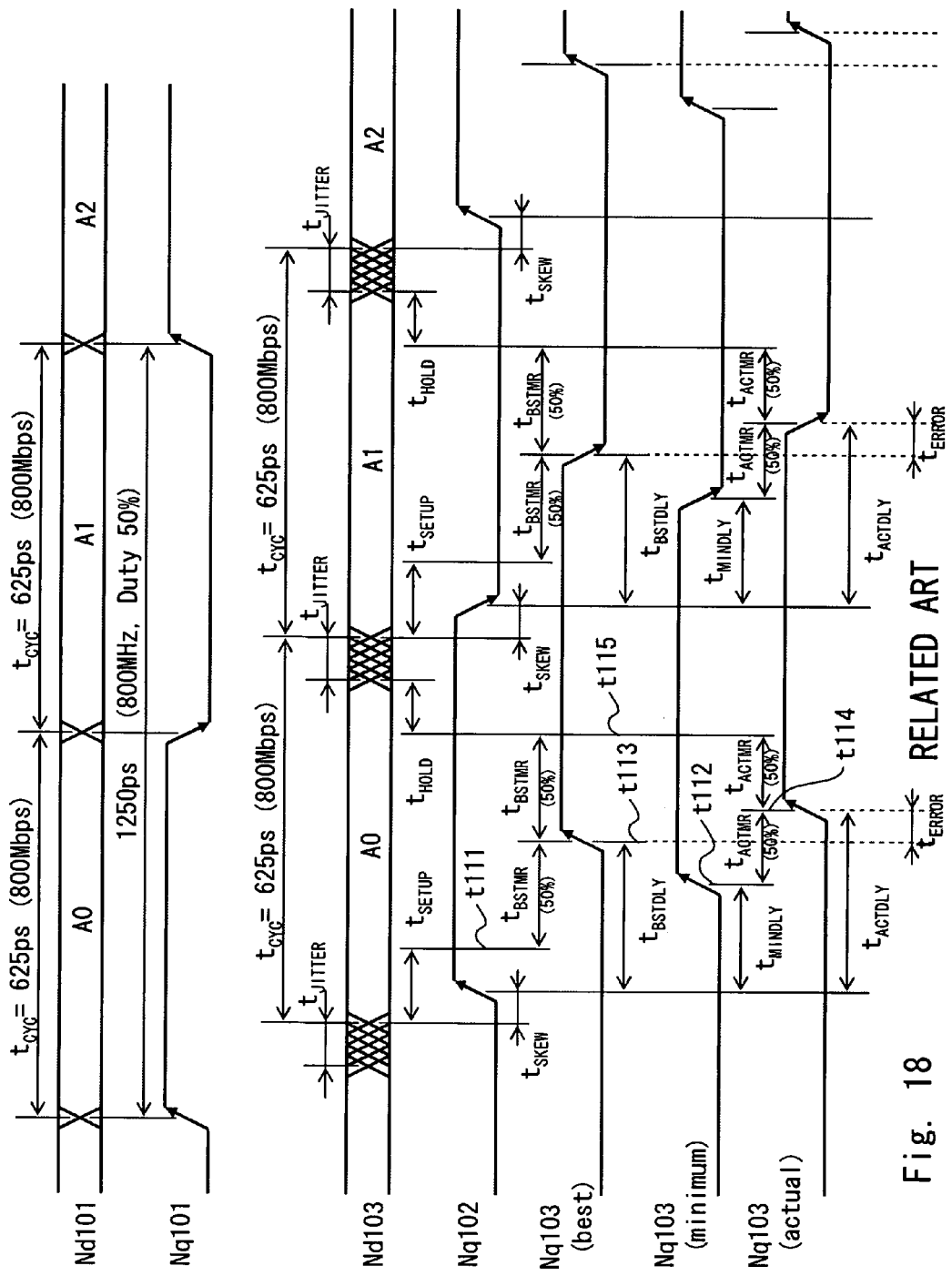
FIG. 18 is a view to describe a delay adjustment method according to the related art where a data transfer speed is 800 Mbps.

FIG. 12 is a flowchart showing a calibration method according to this embodiment. As shown in FIG. 12, the process first selects a path that passes through the variable delay circuit 61 in the semi-fixed delay circuit 65 (Step SP11) just like in the first embodiment. Then, it sets a delay amount of the variable delay circuit 13 to a minimum delay and determines whether it is readable (Step SP12). If reading is impossible, it is determined that a minimum delay is smaller than a setup limit and it is possible to search for a setup limit, so that the calibration operation can be performed. On the other hand, if it is readable in the state of setting a delay amount of the variable delay circuit 13 to a minimum delay, a minimum delay time is larger than a setup time and it is thus unable to search for a setup limit. In this case, the process increases a delay amount of the variable delay circuit 61 in the semi-fixed delay circuit 65 (Step SP13). Then, it sets a delay amount of the variable delay circuit 13 back to a minimum delay amount and, if reading results in failure, the process proceeds to Step SP14, determining that a setup limit is searchable. The processing from Step SP14 is the same as the processing from Step SP2 in FIG. 7.

Because a delay amount of a DQ signal is variable in this embodiment, it is possible to set an optimum fixed delay amount $t_{FIXDLY}$, which minimizes an error in the calibration of a delay amount in a variable delay circuit. Further, if a fixed delay amount is too small to search for a setup limit, it is possible to increase a fixed delay amount to enable searching of a setup limit. Although the configuration of this embodiment allows bypassing of the variable delay circuit in the semi-fixed delay circuit 65, it may include a delay circuit only just like in the first embodiment.

It is apparent that the present invention is not limited to the above embodiments, but may be modified and changed without departing from the scope and spirit of the invention. For example, the above embodiments describe a case of receiving a DQS signal and a DQ signal output from an SDRAM and adjusting the latch timing of the DQ signal. However, it is not limited to a memory such as an SDRAM, and the same operation can be performed when receiving a strobe signal and data output from an LSI or the like and adjusting the timing to latch the received data. Further, although the above embodiments describe a single data bus for simplification of description, there may be a plurality of, e.g. eight, data buses. In such a case, a delay adjustment circuit may be placed for each data bus.

What is claimed is:

1. An interface circuit comprising:
   a calibration circuit to automatically detect a data valid window of a data signal and adjust an optimum delay amount of a data strobe signal; and
   a data signal delay circuit that receives the data signal and delays the data signal by a delay amount $t_{FIXDLY}$ satisfying $t_{FIXDLY} > t_{MINDLY} + t_{SKEW} - t_{SETUP}$ where a minimum delay amount in the calibration circuit is $t_{MINDLY}$, a skew between the data signal and the strobe signal is $t_{SKEW}$, and a setup time of the data signal is $t_{SETUP}$, the data signal delay circuit outputting the delayed data signal to said calibration circuit.

2. The interface circuit according to claim 1, wherein the calibration circuit adjusts an optimum delay amount of the strobe signal using the delayed data signal output from the data signal delay circuit during adjustment mode.

3. The interface circuit according to claim 1, further comprising:
   a data capture circuit that captures the delayed data signal from the data signal delay circuit using the strobe signal during adjustment mode and captures the data signal from a data signal input terminal using the strobe signal during normal operation mode.

4. The interface circuit according to claim 2, further comprising:
   a data capture circuit that captures the delayed data signal from the data signal delay circuit using the strobe signal during the adjustment mode and captures the data signal from a data signal input terminal using the strobe signal during normal operation mode.

5. The interface circuit according to claim 1, further comprising:
   a data capture circuit that captures the delayed data signal from the data signal delay circuit using the strobe signal during adjustment mode and captures the data signal from a data signal input terminal using the strobe signal during normal operation mode; and
   a selector to select between the data signal input through the data signal input terminal and the delayed data signal from the data signal delay circuit and input a selected one to the data capture circuit.

6. The interface circuit according to claim 2, further comprising:
   a data capture circuit that captures the delayed data signal from the data signal delay circuit using the strobe signal during the adjustment mode and captures the data signal from a data signal input terminal using the strobe signal during normal operation mode; and
   a selector to select between the data signal input through the data signal input terminal and the delayed data signal from the data signal delay circuit and input a selected one to the data capture circuit.

7. The interface circuit according to claim 3, further comprising:
   a selector to select between the data signal input through the data signal input terminal and the delayed data signal from the data signal delay circuit and input a selected one to the data capture circuit.

8. The interface circuit according to claim 1, wherein the calibration circuit includes
- a variable delay circuit to delay the strobe signal by a prescribed length of time, and
- a delay adjustment circuit to adjust a delay time in the variable delay circuit.

9. The interface circuit according to claim 2, wherein the calibration circuit includes
- a variable delay circuit to delay the strobe signal by a prescribed length of time, and
- a delay adjustment circuit to adjust a delay time in the variable delay circuit.

10. The interface circuit according to claim 3, wherein the calibration circuit includes
- a variable delay circuit to delay the strobe signal by a prescribed length of time, and
- a delay adjustment circuit to adjust a delay time in the variable delay circuit.

11. The interface circuit according to claim 5, wherein the calibration circuit includes
- a variable delay circuit to delay the strobe signal by a prescribed length of time, and
- a delay adjustment circuit to adjust a delay time in the variable delay circuit.

12. The interface circuit according to claim 8, wherein the delay adjustment circuit includes
- an expectation matching circuit to check matching of a data signal with an expected value,
- a delay amount calculation circuit to calculate an optimum delay amount based on a result of the expectation matching, and
- a delay setting circuit to set a delay amount calculated by the delay amount calculation circuit to the variable delay circuit.

13. The interface circuit according to claim 1, wherein
a delay amount of the data signal delay circuit is variable, and
the interface circuit further comprises a delay adjustment circuit to adjust a delay time in the data signal delay circuit.

14. The interface circuit according to claim 2, wherein
a delay amount of the data signal delay circuit is variable, and
the interface circuit further comprises a delay adjustment circuit to adjust a delay time in the data signal delay circuit.

15. The interface circuit according to claim 3, wherein
a delay amount of the data signal delay circuit is variable, and
the interface circuit further comprises a delay adjustment circuit to adjust a delay time in the data signal delay circuit.

16. The interface circuit according to claim 5, wherein
a delay amount of the data signal delay circuit is variable, and
the interface circuit further comprises a delay adjustment circuit to adjust a delay time in the data signal delay circuit.

17. The interface circuit according to claim 8, wherein
a delay amount of the data signal delay circuit is variable, and
the interface circuit further comprises a delay adjustment circuit to adjust a delay time in the data signal delay circuit.

* * * * *